(12) United States Patent
Eden et al.

(10) Patent No.: US 12,174,544 B2
(45) Date of Patent: Dec. 24, 2024

(54) PHOTORESIST-FREE DEPOSITION AND PATTERNING WITH VACUUM ULTRAVIOLET LAMPS

(71) Applicant: The Board of Trustees of the University of Illinois

(72) Inventors: J. Gary Eden, Champaign, IL (US); Andrey Mironov, Urbana, IL (US); Dane J. Sievers, Fisher, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 222 days.

(21) Appl. No.: 17/612,830

(22) PCT Filed: May 14, 2020

(86) PCT No.: PCT/US2020/032908
§ 371 (c)(1),
(2) Date: Nov. 19, 2021

(87) PCT Pub. No.: WO2020/236518
PCT Pub. Date: Nov. 26, 2020

(65) Prior Publication Data
US 2022/0221799 A1    Jul. 14, 2022

Related U.S. Application Data

(60) Provisional application No. 62/851,168, filed on May 22, 2019.

(51) Int. Cl.
*G03F 7/20* (2006.01)
*C23C 18/16* (2006.01)
(Continued)

(52) U.S. Cl.
CPC ...... *G03F 7/70016* (2013.01); *C23C 18/1608* (2013.01); *C25D 7/12* (2013.01);
(Continued)

(58) Field of Classification Search
CPC .... G03F 7/70016; G03F 7/164; G03F 7/0042; G03F 7/09; G03F 7/2004; G03F 7/2014;
(Continued)

(56) References Cited

U.S. PATENT DOCUMENTS 6,084,938 A    7/2000  Hara et al.
7,470,503 B1  12/2008  Brandl
(Continued)

FOREIGN PATENT DOCUMENTS

CN    101488461 A    7/2009
WO    2020036971 A1  2/2020

OTHER PUBLICATIONS

Asakura et al., "A simple lithographic method employing 172 nm vacuum ultraviolet light to prepare positive- and negative-tone poly(methyl methacrylate) patterns", Thin Solid Films, 2006, pp. 237-240, vol. 500, Elsevier.
(Continued)

*Primary Examiner* — Mesfin T Asfaw
(74) *Attorney, Agent, or Firm* — Greer, Burns & Crain, Ltd.; Steven P. Fallon

(57) ABSTRACT

A method for photoresist-free photolithography to pattern a surface of conductor or semiconductor substrate and deposit a material includes surface cleaning and irradiating a surface through a mask with VUV photons from a lamp. Photons are generated with a VUV lamp having a wavelength of 160 nm-200 nm and with an intensity sufficient to alter the surface. The photons are directed through a mask pattern to alter the surface chemistry or structure in those areas of the substrate defined by the mask. Material is selectively deposited onto the surface, in those portions of the surface that are exposed to the VUV photons, or unexposed to the VUV photons, depending on the substrate surface. A method uses a seed film and then electroplates metal onto the seed film in
(Continued)

the mask pattern. A method provides for electroless deposition of metal and another for altering surface chemistry in the mask pattern.

20 Claims, 7 Drawing Sheets

(51) Int. Cl.
*C25D 7/12* (2006.01)
*G03F 7/00* (2006.01)
*G03F 7/16* (2006.01)
*H01L 21/288* (2006.01)

(52) U.S. Cl.
CPC ............ *G03F 7/164* (2013.01); *H01L 21/288* (2013.01); *H01L 21/2885* (2013.01)

(58) Field of Classification Search
CPC ......... G03F 7/26; C23C 18/1608; C25D 7/12; H01L 21/288; H01L 21/2885; H01L 21/76885; H01L 21/76862; H01L 21/76873
See application file for complete search history.

(56) References Cited

U.S. PATENT DOCUMENTS

| | | | |
|---|---|---|---|
| 7,585,549 | B2 | 9/2009 | Lewis et al. |
| 7,684,014 | B2 | 3/2010 | Sewell et al. |
| 7,879,531 | B2 | 2/2011 | Zhang et al. |
| 8,758,974 | B2 | 6/2014 | Soper et al. |
| 9,390,941 | B2 | 7/2016 | Watanabe et al. |
| 2004/0091798 | A1* | 5/2004 | Moore ................ C03C 3/06 430/323 |
| 2007/0218704 | A1* | 9/2007 | Ishizaka ............ H01L 21/76843 257/E21.295 |
| 2008/0174241 | A1 | 7/2008 | Cooper et al. |
| 2017/0140927 | A1 | 5/2017 | Shih et al. |
| 2018/0068754 | A1* | 3/2018 | Dylewicz .......... H01L 21/67051 |

OTHER PUBLICATIONS

Dölle et al., "Gradual Photochemical-Induced Conversion of Liquid Polydimethylsiloxane Layers to Carbon Containing Silica Coatings by VUV Irradiation at 172 nm", Langmuir, 2009, pp. 7129-7134, vol. 25, No. 12, American Chemical Society.
Cefalas et al., "Absorbance and outgasing of photoresist polymeric materials for UV lithography below 193 nm including 157 nm lithography", Microelectronic Engineering 53, 2000, pp. 123-126, Elsevier.
Eden, "Photochemical Vapor Deposition", Thin Film Processes II, 1991, pp. 443-500, Academic Press, Inc.
Gan et al., "Fabrication of cell pattern on poly(dimethylsiloxane) by vacuum ultraviolet lithography", Colloids and Surfaces B: Biointerfaces, 2010, pp. 381-385, vol. 76, Elsevier.
Hamamoto et al., "Cleaning of extreme ultraviolet lithography optics and masks using 13.5 nm and 172 nm radiation", Journal of Vacuum Science & Technology B, 2005, pp. 247-251, vol. 23, No. 1, American Vacuum Society.
Hu et al., "Fabrication of fluidic chips with 1-D nanochannels on PMMA substrates by photoresist-free UV-lithography and UV-assisted low-temperature bonding", Microfluid Nanofluid, 2011, pp. 1223-1232, vol. 10, Springer.
Printz et al., "Photoresist-Free Patterning by Mechanical Abrasion of Water-Soluble Lift-Off Resists and Bare Substrates: Toward Green Fabrication of Transparent Electrodes", Plos One, 2013, pp. 1-10, vol. 8, No. 12, Plos.
Maezono et al., "Study of Refractive Index Change in Ge-Doped Fibers with Vacuum Ultraviolet Light Irradiation", Japanese Journal of Applied Physics, 2008, pp. 7266-7268, vol. 47, No. 9, The Japan Society of Applied Physics.
Shin et al., "Photoresist-Free Lithographic Patterning of Solution-Processed Nanostructured Metal Thin Films", Advanced Materials, 2008, pp. 3457-3461, vol. 20, WILEY-VCH Verlag GmbH & Co. KGaA, Weinheim.
Lim et al., "Photoresist-Free Fully Self-Patterned Transparent Amorphous Oxide Thin-Film Transistors Obtained by Sol-Gel Process", Scientific Reports, 2014, pp. 1-6, vol. 4, No. 4544, Nature.
Yamaguchi et al., "A Study of Photoresist Pattern Freezing for Double Imaging using 172nm VUV Flood Exposure", Journal of Photopolymer Science and Technology, 2008, pp. 697-704, vol. 21, No. 5, The Society of Photopolymer Science and Technology.
International Search Report and Written Opinion from the corresponding International Patent Application No. PCT/US2020/032908, dated Sep. 14, 2020.

* cited by examiner

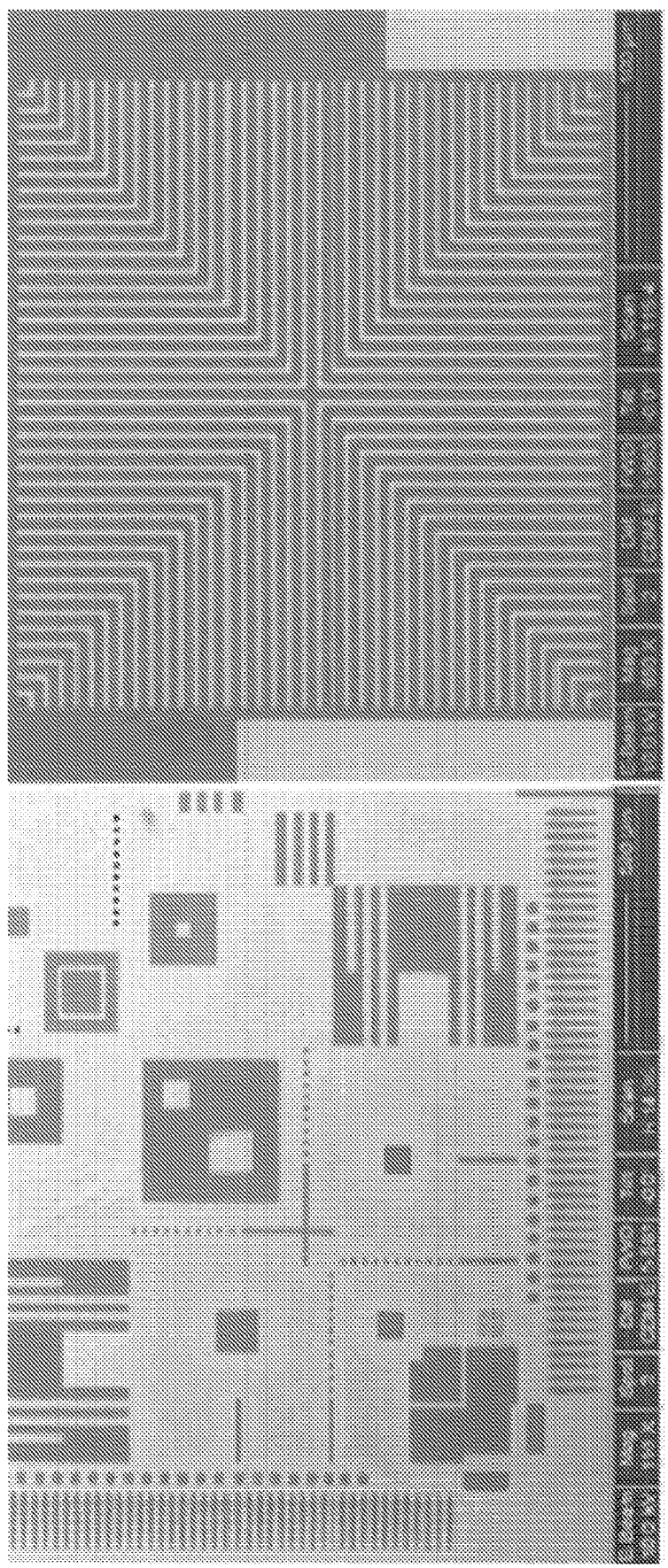

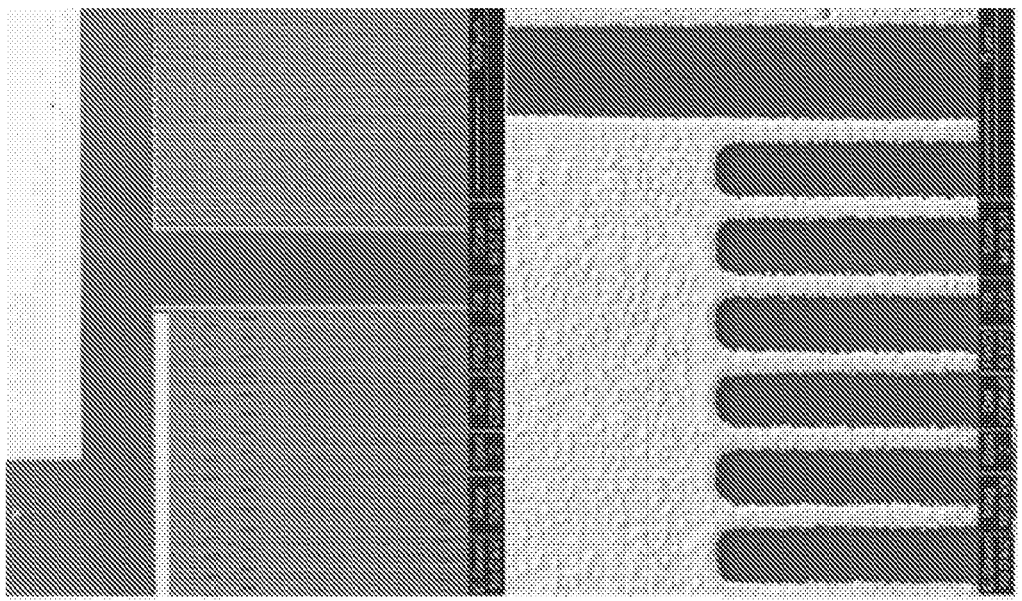
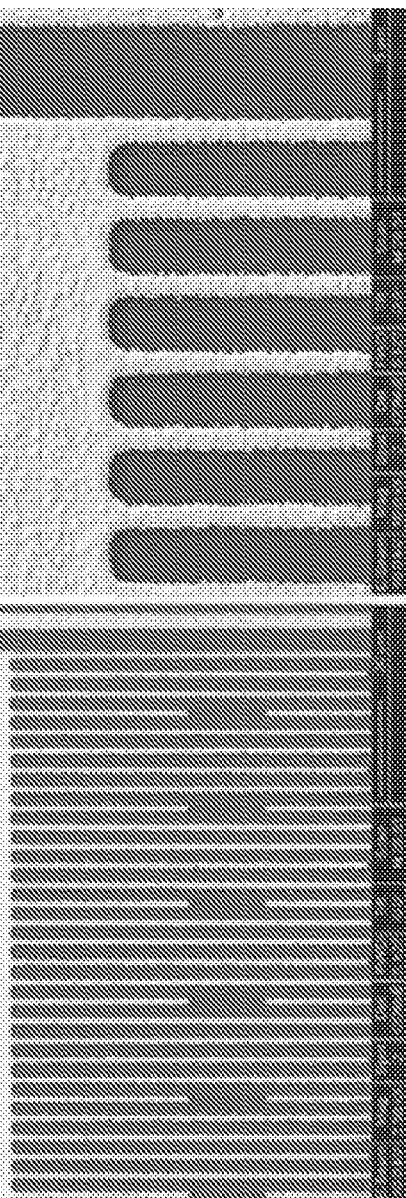
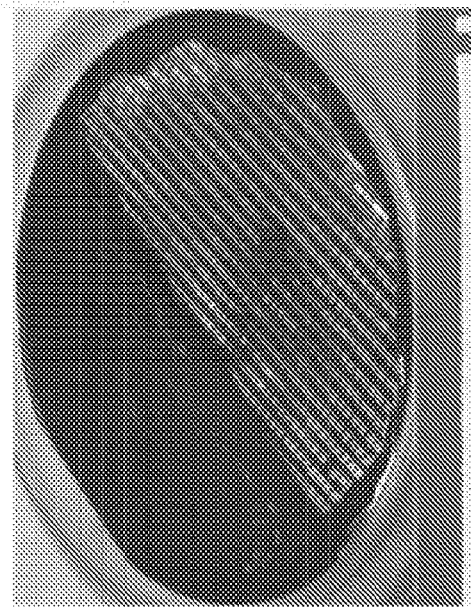
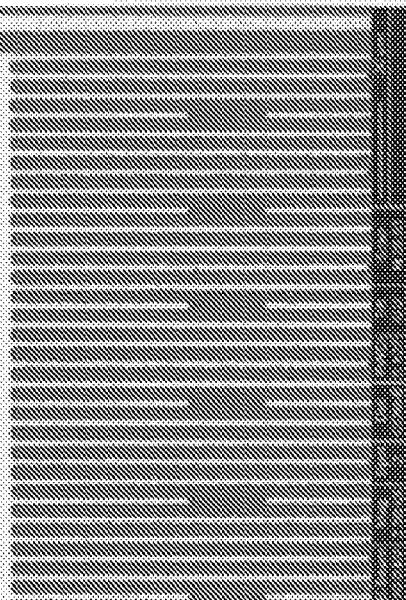
FIG. 6A
FIG. 6B
FIG. 6C
FIG. 6D

PHOTORESIST-FREE DEPOSITION AND PATTERNING WITH VACUUM ULTRAVIOLET LAMPS

PRIORITY CLAIM AND REFERENCE TO RELATED APPLICATION

The application claims priority under 35 U.S.C. § 119 and all applicable statutes and treaties from prior U.S. provisional application Ser. No. 62/851,168, which was filed May 22, 2019.

STATEMENT OF GOVERNMENT INTEREST

This invention was made with government support under grant number FA9550-14-1-0002 awarded by the U.S. Air Force Office of Scientific Research. The government has certain rights in the invention.

FIELD

Fields of the invention include photolithography and photo-processing of thin films and bulk materials, including the patterning, etching, and deposition of materials, with lamps emitting predominantly in the vacuum ultraviolet (VUV) region of the electromagnetic spectrum. Applications of the invention include low-cost processes for photoresist-free electrodeposition and patterning of metal films on semiconductors, dielectrics, and conductive surfaces, thereby reducing the dependence on photoresist-based processes and their associated solvents in the fabrication of optical and electronic devices (as well as integrated optical and electronic systems).

BACKGROUND

Photoresists currently play a fundamental role in the fabrication and processing of virtually all semiconductor devices (such as microprocessors, DRAM, and semiconductor lasers) as well as optical devices and systems such as sensors and displays. For example, photoresist is often applied to the surface of a semiconductor wafer as a thin film, and it serves the purpose of defining (on the surface) the pattern (also known as the "layout") for the transistors, other devices, and interconnections. Illuminating the photoresist layer through a photolithographic mask with ultraviolet radiation alters the chemical structure of the irradiated regions of the photoresist, and subsequent chemical processing of the photoresist (generally with liquid solvents or alkaline solutions) removes either the photo-exposed or unexposed regions, depending on the design of the photoresist. It has long been known that photoresists have several drawbacks, including: 1) cost, 2) toxicity, and 3) the environmental and financial impact of recycling (or disposing of) large volumes of the solvents and alkaline solutions necessary to remove the exposed photoresist.

The overall cost of employing photoresists in the fabrication of micro- and nano-scale electronic and photonic devices has several components. The first of these is simply that the photoresist itself is expensive and often toxic. Secondly, the process of exposing the photoresist generally requires the evacuation of the photolithographic tool and associated chamber. In addition, fabrication times are lengthened because of the necessity of removing the semiconductor wafer (or other device substrate) from the lithographic tool after each photoresist exposure and transporting the wafer to the next tool in the fabrication sequence. When one considers that the process sequence for fabricating sophisticated electronic devices such as microprocessors generally involves not one, but multiple, photoresist exposures, it is clear that photoresist steps significantly raise the expense of the overall device or "chip" fabrication process.

Recent developments have resulted in the commercial availability of thin, flat lamps emitting at 172 nm (in the vacuum ultraviolet region of the spectrum) and other wavelengths in the VUV and ultraviolet regions of the electromagnetic spectrum. Specifically, the vacuum ultraviolet (VUV) and ultraviolet regions of the spectrum are generally accepted to be those lying in the 100-200 nm and 200-400 nm wavelength intervals, respectively. The 172 nm lamps, in particular, offer properties (such as intensities above 150 mW/cm$^2$ and "wall-plug" efficiencies beyond 20%) that are unprecedented in this short wavelength region. Several of the characteristics of these lamps have been described in S.-J. Park et al., "25 W of Average Power at 172 nm in the Vacuum Ultraviolet from Flat, Efficient Lamps Driven by Interlaced Arrays of Microcavity Plasmas," APL Photonics, vol. 2, 041302 (2017). Although 172 nm-emitting lamps have been available for decades, previous lamps were cylindrical and produced only low intensities (typically less than 50 mW/cm$^2$). Cylindrical lamps or bulbs, in particular, require reflecting optics located behind the lamp so as to produce a spatially-uniform intensity at a desired, flat surface.

In 2006, Asakura et al. [1], eroded a PMMA film with 172 nm radiation that also illuminated a substrate. Removing the film required a pressure of 1000 Pa (approximately 0.8 Torr) of room air in the chamber for the process to occur. Thus, approximately 0.2 Torr of oxygen ($O_2$) was present in the chamber, and it is well-known that 172 nm photons are efficient in converting $O_2$ into ozone ($O_3$). It is ozone that is responsible for the results of Asakura, as the authors acknowledge in the article (attributing film erosion to "activated oxygen"). This severely limits the applicability of the process, and does not permit multiple steps to occur in a single tool, or continuous processing.

REFERENCES

[1] S. Asakura, A. Hozumi, T. Yamaguchi, and A. Fuwa, Thin Solid Films 500, 237 (2006).
[2] C. Done, M. Papmeyer, M. Ott, and K. Vissing, Langmuir 25, 7129 (2009).
[3] H. Sewell, D. McCafferty, and L. J. Markoya, U.S. Pat. No. 7,684,014 (Mar. 23, 2010)
[4] J. Gan, H. Chen, F. Zhou, H. Huang, J. Zheng, W. Song, L. Yuan, and Z. Wu, Colloids and Surfaces B: Biointerfaces 76, 381 (2010).
[5] A. C. Cefalas, E. Sarantopoulou, E. Gogolides, and P. Argitis, Microelectronic Engr. 53, 123 (2000).
[6] Y. Maezono, Y. Iwasa, M. Wasamoto 1, I. Yamamoto, M. Katto, and A. Yokotani, Japan. J. Appl. Phys. 47, 7266 (2008).
[7] K. Hamamoto, Y. Tanaka, T. Watanabe, N. Sakaya, M. Hosoya, T. Shoki, H. Hada, N. Hishinuma, H. Sugahara, and H. Kinoshita, J. Vac. Sci. Technol. B, Vol. 23, 247 (2005).
[8] M. Yamaguchi, T. Wallow, Y. Yamada, R.-H. Kim, J. Kye, and H. J. Levinson, "A Study of Photoresist Pattern Freezing for Double Imaging using 172 nm VUV Flood Exposure", Proc. 25th Int. Conf. Photopolymer Sci. Technol. (ICPST-25, 2008).
[9] J. G. Eden, Photochemical Vapor Deposition (Wiley & Sons, 1992).

[10] X. Hu, Q. He, X. Zhang, and H. Chen, "Fabrication of fluidic chips with 1-D nanochannels on PMMA substrates by photoresist-free UV-lithography and UV-assisted low-temperature bonding", Microfluidics and Nanofluidics, vol. 10, 1223-1232 (2010). Doi:10.1007/s10404-010-0753-6.

[11] H. Soo Lim, You-Seung Rim, and H. Kim, "Photoresist-Free Fully Self-Patterned Transparent Amorphous Oxide Thin-Film Transistors Obtained by Sol-Gel Process", Scientific Reports, Vol. 4, 4544; doi:10.1038/srep04544.

[12] H. Shin, H. Kim, H. Lee, H. Yu, J. Kim, H. Kim, and M. Lee, "Photoresist-Free Lithographic Patterning of Solution-Processed Nanostructured Metal Thin Films", Advanced Materials, Vol. 20, 3457-3461 (2008); doi: 10.1002/adma.200800157.

[13] A. Printz, E. Chan, C. Uong, R. S. Martinez, and D. Lipomi, "Photoresist-Free Patterning by Mechanical Abrasion of Water-Soluble Lift-Off Resists and Bare Substrates: Toward Green Fabrication of Transparent Electrodes", PloS One, vol. 8, e83939 (2008). Doi: 10.1371/journal.pone.0083939.

SUMMARY OF THE INVENTION

A preferred embodiment provides a method for photoresist-free photolithography to pattern a surface of a conductor or semiconductor substrate and deposit a material which includes cleaning the surface. Photons are generated with a VUV lamp having a wavelength of 160 nm-200 nm and intensity sufficient to alter the surface. The photons are directed through a mask pattern to alter the surface chemistry in those areas of the surface exposed by the mask pattern. Material is selectively deposited onto the portions of a semiconductor surface that are exposed or unexposed by the mask pattern, depending on whether the surface oxide has been stripped from the substrate or not. If the substrate is a conductor such as a metal, electrodeposition occurs only on those portions of the substrate that have not been exposed to the VUV source. The semiconductor substrate in example applications can be a silicon wafer, or can be SiC, InP, and a III-V semiconductor. The VUV lamp preferably is a microplasma flat lamp generating photons at an intensity above 10 mW/cm$^2$ A photolithography or photoprocessing fabrication tool includes a chamber, a gas inlet and exhaust, a wafer or substrate holder, a VUV lamp photon source having a wavelength of 160 nm-200 nm and intensity sufficient to alter the surface structure of a semiconductor surface, and a mask for spatially-selective blocking of photons directed toward a surface of a wafer or substrate on the holder. The chamber can be a non-vacuum (atmospheric pressure) chamber open for flow.

A method for photoresist-free deposition of metal onto a material surface includes depositing a seed film onto the material surface, generating photons with a VUV lamp having a wavelength of 160 nm-200 nm and intensity sufficient to alter the surface structure or surface chemistry of the seed film, directing the photons through a mask pattern to alter the surface structure or surface chemistry of the seed film, and electroplating metal onto the seed film.

A method for photoresist-free deposition of metal onto a dielectric surface includes generating photons with a VUV lamp having a wavelength of 160 nm-200 nm and intensity sufficient to alter the surface chemistry or surface structure so as to create a charge pattern on the dielectric surface, directing the photons through a mask pattern so as to create the charge pattern in the pattern of the mask, and electroless deposition of metal onto the dielectric surface in the charge pattern defined by the mask.

A method for photoresist-free alteration of a material surface in a pattern, generating photons with a VUV lamp having a wavelength of 160 nm-200 nm and intensity sufficient to alter the structure or surface chemistry of the surface, directing the photons at the surface to alter surface chemistry or structure of the surface. The material surface can be changed from hydrophobic to hydrophilic, for example.

BRIEF DESCRIPTION OF THE DRAWINGS

FIGS. 4A and 4B are images at two magnifications of a gold pattern deposited by the positive (light-field) photodeposition process;

FIGS. 6A-6D are photographs of arrays of gold lines ("fingers") grown by the positive photodeposition process.

DETAILED DESCRIPTION OF THE PREFERRED EMBODIMENTS

Figure 1:
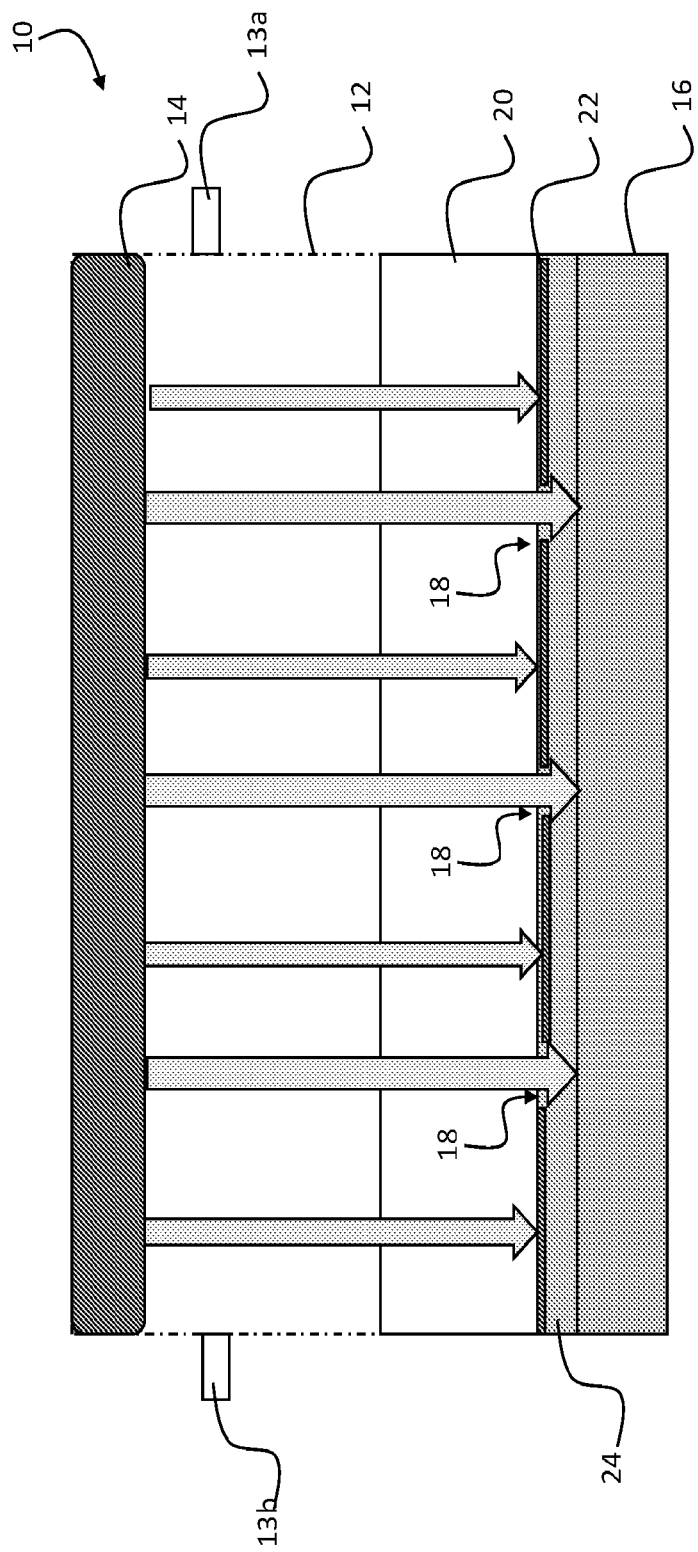
FIG. 1 is a schematic cross-sectional diagram of a preferred embodiment of a photoresist-free photolithography system.

A preferred method includes irradiating the surface of a semiconducting material (such as a Si wafer) or conductive material (such as Ni, Au or ITO) directly through a photolithographic mask, in the absence of a photoresist layer upon the semiconductor substrate. Other semiconductor substrates such as SiC (Silicon Carbide), Ge, and InP (Indium Phosphide) can also be used. The preferred method involves directly irradiating the wafer surface in a pattern through a mask with a VUV lamp emitting at wavelengths between ~160 nm and ~200 nm, preferably from 167-177 nm. If the semiconductor surface has been cleaned (i.e., the native oxide has been stripped-off), then the illumination of surfaces with photons having wavelengths in this wavelength region appears to alter the electronic structure of the surface. Regardless of the effect of the VUV photons on the semiconductor surface, the result is that electrodeposition of metals onto the post-irradiated semiconductor surface will occur only on those regions of the substrate that were not exposed to the incoming VUV radiation. That is, the irradiation of a semiconductor surface prepares the surface for the deposition of a metal film by electrodeposition only onto those regions not illuminated by the VUV source. The same procedure is used for the irradiation of metal surfaces and the subsequent electrodeposition of other metals. Electrodeposition onto metal surfaces that have been irradiated with VUV photons will occur only in those regions that have not been exposed to the VUV radiation. For other substrate-metal film combinations, film growth occurs only on those regions that have been exposed to the VUV source. One example is the irradiation of silicon surfaces having a thin oxide layer on the surface. In this situation, subsequent electrodeposition occurs only on those portions of the substrate that have been exposed to the incoming VUV photons.

The details concerning the structural (electronic and chemical bonding) modifications of the substrate surface produced by the incoming VUV photons are not completely understood at present, but experiments show clearly that whether the films are grown in photo-exposed regions ("light-field" deposition) or unexposed ("dark-field" deposition) regions is dependent upon the material. In one preferred embodiment, the photolithographic mask is in contact with the Si wafer (although contact photolithography is not necessary) and the surface is irradiated for 2 seconds to 5 minutes, depending upon the intensity of the lamp. During the irradiation process, the lamp, mask, and semiconductor wafer are all preferably immersed in nitrogen (e.g., one atmosphere of dry nitrogen). Non-contact (projection) lithography is an alternative method for exposing pre-determined areas of the Si substrate.

In all of the embodiments described here, the VUV lamp source serves two purposes: 1) to photochemically alter a material surface so that a subsequent electrodeposition process will, or will not, occur on regions of the substrate exposed to the incoming VUV radiation, and 2) in combination with a photolithographic mask or projection system, defines the desired pattern of the metal film(s) deposited onto a substrate.

There is no need to evacuate such a photo-processing chamber, thereby lowering processing costs significantly. That is, because 160-200 nm radiation is not absorbed to a significant degree by nitrogen, the air initially in the chamber can be replaced by nitrogen by slowing flowing nitrogen into the chamber. In this way, it is not necessary to evacuate the air in the chamber with a vacuum pump. Furthermore, no solvents (other than those that might be required to clean a surface) are necessary because the photoresist has been eliminated. After irradiating the surface, metal films or dielectric films are deposited onto the unexposed portions of specific substrates by electrodeposition (also known as electroplating). Alternatively, the selective deposition can also be controlled so as to form the films on the exposed portions of the surfaces of other materials. Therefore, both positive and negative photoresist-less photolithography are provided and have been demonstrated experimentally. The method is applicable to the electrodeposition of metals other than gold such as chromium (Cr), nickel (Ni), copper (Cu), palladium (Pd), platinum (Pt), and other metals that can be deposited by electroplating. In addition, dielectrics such as metal-oxides and metal-nitrides can be deposited because the VUV photons appear to alter the electronic structure of the surfaces of several substrate materials so as to significantly enhance the propensity for chemical bonding to the surface at these sites. An ultra-thin layer of water or hydrogen peroxide further accentuates this bonding process.

Laboratory experiments have observed the lateral spatial resolution of the deposited metal film (i.e., feature size along the film surface) to be as small as 800 nm to date. Much better values are achievable with improved masks and optical design. Preferred methods are believed to yield patterns of nanoscale features in which all of the features are of equal quality, regardless of crystal orientation and whether a semiconductor wafer (for example) is doped n- or p-type.

Preferred fabrication tools and methods thus provide photolithographic processes that do not require chemical processing of a photoresist in a separate tool or by wet chemical processing. Preferred tools and methods lower the cost of photolithography and increase significantly the rate at which materials can be processed and devices fabricated. Furthermore, the simplicity of metal film deposition processes provides significant reduction in the cost of associated patterning tools, as compared to commercial processes and photolithographic systems currently in use by large commercial semiconductor manufacturers of microprocessors, DRAMs, and photonic and electronic devices such as lasers and sensors.

The electrical and metallurgical qualities of the metal films deposited by the processes described below appear to be comparable or superior to those deposited by conventional photoresist/liquid solvent removal/electrodeposition processes.

Preferred fabrication tools and methods use a flat lamp as the VUV photon source during lithography. The flat lamp photon source can be in close proximity to, or within, a processing chamber. This is not possible at present with laser or XUV lithography, both of which require physically large sources of radiation. The cost of the flat lamp sources of VUV radiation is at least an order of magnitude lower than that of existing laser photon sources most often employed in commercial fabrication processes. When the flat lamp photon source is integrated into the processing chamber, the function provided by the lamp depends solely on the lamp wavelength(s), intensity, and the combination of gases and vapors introduced to the chamber. Importantly, preferred fabrication tools and methods alter conventional photolithographic processes for manufacturing micro- and nano-electronic devices, by enabling etching, deposition, and other processes to be performed within the same chamber and with the same tool.

Suitable lamps for photon sources in fabrication tools and methods of the invention include the 172 nm, flat lamps discussed in the background and described in S.-J. Park et al., "5 W of average power at 172 nm in the vacuum ultraviolet from flat, efficient lamps driven by interlaced arrays of microcavity plasmas," APL Photonics, vol. 2, 041302 (2017). The wavelength of this VUV radiation corresponds to a photon energy of 7.2 eV, which the present inventors have recognized as being capable of breaking most chemical bonds, thereby enabling the initiation of any of several electronic device fabrication processes by photochemistry at a surface or in the gas phase. Recently, flat lamps emitting at 126 nm, 147 nm, 222 nm, 308 nm, and 165~200 nm have also been demonstrated but the output powers and efficiencies currently available with these lamps are lower at present than those available at 172 nm. The latter of these lamps (~165-200 nm) relies on the conversion of ~172 nm photons with a specific phosphor. Although the intensities provided by this lamp (typically, several $mW/cm^2$) are, at present, not as large as those available from 172-emitting lamps (intensities above 200 $mW/cm^2$ are currently available), these lower intensities are sufficient to drive the processes described here. Furthermore, the phosphor film (coated onto the interior face of the lamp's output window) can be chosen so as to radiate over a fraction of the 160-200 nm region (and extend into the 200-220 nm interval, if desired) or radiate over several narrow wavelength regions simultaneously in the 160-200 nm interval. Experiments with 172 nm lamps, in particular, have confirmed a photolithographic method and tool capable of rapidly forming any desired pattern directly into the surface of a semiconductor wafer and then replicating that pattern, or the negative image of that pattern, on the surface of the wafer through a subsequent electrodeposition process.

While preferred methods use the flat lamps described in the previous paragraph, methods of the invention are dependent only on the wavelength and intensity emitted by the VUV lamp Therefore, VUV lamps having conventional cylindrical, quasi-cylindrical (slightly "flattened"), or bulb-type envelopes are also acceptable, although such lamps generally require the use of reflectors to capture the VUV radiation emitted in all directions by the lamp, and direct that radiation to a surface in a manner that yields a uniform intensity distribution. Such reflecting optics are expensive and bulky. Flat lamps are preferable for the purpose of scaling the processing area and reducing the cost of the VUV source, but conventional VUV lamps can enable the metal electroplating of preferred embodiment methods if the wavelengths emitted by the lamp are within acceptable bounds (generally, 160-200 nm) and the intensity in this wavelength region is above approximately 1-10 mW/cm$^2$.

Methods of the invention, with a VUV lamp having the correct wavelength and intensity, allow for photochemical reactions not observed previously to be applied to industrial processes. For example, experiments have demonstrated the deposition of metal films onto a variety of surfaces, including semiconductors, using metals such as gold and nickel, and conducting dielectrics such as indium tin oxide (ITO).

Materials other than semiconductors have been found to perform equally well as substrates for the electrodeposition/patterning process. Specifically, the electrodeposition of gold and/or copper onto post-irradiated nickel (Ni), ITO, InP, and Au itself have been demonstrated. Materials other than these (such as GaAs, GaN, InGaN, and all of the III-V binary and ternary compounds, as well as other metals such as tin, copper, steel, and aluminum) are also expected to serve well as substrates in methods of the invention. Depositing gold on gold, or gold onto InP, are of particular commercial interest. The deposition of gold onto the III-V compound semiconductor materials is also of considerable value because forming high quality electrical contacts on semiconductor lasers has a critical impact on the efficiency and lifetime of the laser. In all of these instances in which an electrically-conducting material is electrodeposited onto another conducting material, deposition occurs only on those portions of the substrate material surface that have not been exposed to the VUV radiation.

All of the metal deposition processes presented here can be scaled in size so as to process metal (or other conductive) substrate sheets up to at least 1 m in the transverse dimension. Furthermore, semiconductor wafers having diameters up to, and beyond, 1 m can also be processed by the methods described here. That is, more than one VUV emitting lamp can be employed so as to irradiate larger areas. This is straightforward with the preferred flat lamps, because the area uniformly irradiated by the flat lamps can be scaled by tiling. No additional optics, such as those required by cylindrical VUV lamps, for example, are necessary to capture most of the radiation generated by such lamps and direct that radiation onto a flat surface so as to obtain spatially-uniform intensities.

Preferred embodiments of the invention will now be discussed with respect to the drawings and experiments used to demonstrate the invention. The drawings may include schematic representations, which will be understood by artisans in view of the general knowledge in the art and the description that follows. Features may be exaggerated in the drawings for emphasis, and features may not be to scale.

FIG. 1 shows a preferred system 10 of the invention. This diagram of system 10 shows an associated chamber 12, which would preferably include an inlet 13a for introducing nitrogen gas and an outlet 13b for outflow. FIG. 1 illustrates a contact photolithography configuration for the VUV exposure of a material surface within the chamber 12. A planar VUV lamp 14 having a wavelength in the range of 160 nm to 200 nm, in a preferred embodiment with flat VUV lamps emitting at a wavelength of 172 nm, and providing intensities typically above 10 mW/cm$^2$, irradiates the surface of a sample 16 (e.g., semiconductor wafer, conductor sheet, etc.) through openings 18 in a photomask 20 having a masking layer 22. The photomask preferably is based on a thin, fused silica plate 20 that serves to maintain the flatness of a chromium/chromium-oxide masking layer 22. In other words, the silica plate 20 provides structural integrity, while transmitting the incoming VUV radiation as efficiently as possible. Fused silica is often employed in VUV masks because of its high transmission in the VUV spectral region. The masking layer 22, deposited onto the photomask base 20, defines the desired pattern of VUV illumination on the surface of the sample 16. Such silica flat/masking layer photomasks are available commercially. An ultra-thin layer (typically less than 5 µm in thickness) 24 of deionized-water, hydrogen peroxide, or air is optionally introduced between the mask 22 and the sample 16. Doing so has been found to enhance the response of the sample 16 to the VUV radiation.

The chamber 12 preferably contains one atmosphere of nitrogen so as to avoid the absorption of the VUV radiation by the oxygen in room air. For example, when an oxygen molecule absorbs a 7.2 eV photon (corresponding to a wavelength of 172 nm), an ozone molecule is likely to be formed. On the other hand, absorption of 172 nm radiation by nitrogen is negligible, thereby allowing the process to be performed at atmospheric pressure while preventing the formation of ozone or molecules that might be hazardous or interfere with the photolithographic exposure process. It is well-known that nitrogen does not absorb radiation significantly for wavelengths as short as less than ~160 nm. Consequently, the preferred methods, processes, and tools described here permit the use of lamps emitting at wavelengths as short as 160 nm, and do so in conjunction with a nitrogen atmosphere in chamber 12. Another benefit, therefore, is that the chamber 12 need not have an associated vacuum system, normally required for evacuating photolithography tools. The ability to consistently realize photolithographic features in the sub-1 µm region at atmospheric pressure lowers cost and increases the speed of fabrication. It should be reiterated that the room air initially present in the chamber need not be evacuated with a pump, but can gradually be displaced by dry nitrogen by slowly flowing the gas into the chamber, and providing a vent out of which air is able to exit the chamber.

As noted earlier, system 10 can also benefit from the presence of residual air, water, or other intentionally-introduced molecules (such as hydrogen peroxide) between the mask and the Si wafer surface in the optional ultra-thin layer 24. Although the substitution of nitrogen for room air in virtually all of the chamber is advantageous as described earlier, experiments have shown that a small amount of air or water in the very thin region between the mask and the substrate (inadvertently present in early experiments) can improve the surface exposure process quite significantly. Specifically, tests demonstrate clearly that layer 24 can increase the contrast of the photolithographic process and does not negatively impact the process in any way. This result is surprising and contradicts conventional practice in which considerable expense and effort are devoted to the elimination of all air, water, or other molecular species from conventional photolithographic tools and, in particular, the region(s) adjacent to the semiconducting surface and the mask. We have found that these species can be an asset (rather than a liability) to the photolithographic process. Because obtaining a vacuum in the chamber 12 is no longer necessary, accommodating the air, water, or hydrogen peroxide layer 24 becomes straightforward.

In the first experiments to demonstrate the invention, Si semiconducting wafers were doped n- or p-type and were cleaned by a conventional process which includes rinsing with acetone (for degreasing), isopropanol, and deionized water and subsequent drying with nitrogen. The degreased wafers were then immersed into a 50 parts deionized water-to-one part hydrofluoric acid solution to remove native oxides from the surface of the wafer. After placing the fused silica/metal photomask in contact with the wafer, the assembly was placed into an enclosure that was subsequently filled with dry nitrogen to a pressure of one atmosphere. The wafer was then irradiated by a 172 nm lamp for time periods ranging from 2 seconds to 5 minutes. The exposure time is dictated by the intensity available from the lamp. All of the results presented in the discussion to follow were obtained with a lamp producing an intensity of approximately 100 mW/cm$^2$ (at a distance of 2.5 cm from the lamp surface) and an exposure time of 40 seconds. However, we note that subsequent experiments have shown that the lamp intensities of these early experiments are often not necessary. The lamp intensity and energy dosage of the surface (Joules/cm$^2$= (Lamp Intensity at the surface×Time) required is dependent on the surface material. For a lamp intensity of 100 mW/cm$^2$, an exposure of 40 seconds corresponds to an energy dosage of 4 J/cm$^2$. However, considerably lower energy dosages such 10-100 mJ/cm$^2$ were also shown to be effective. As described above, the Si substrates were cleaned only through a degreasing step and etching of the native oxide. More rigorous cleaning processes such as the RCA etch, oxygen plasma, and IMEC can be used, but the more aggressive (and expensive) cleaning processes are not necessary for the growth of a wide variety of films.

Additional experiments were conducted in which the procedure was identical to that described above except that approximately 500 μL of deionized (DI) water or hydrogen peroxide was applied to the surface of the Si wafer prior to mating the wafer to the photomask. Doing so produced the ultra-thin liquid layer 24 between the wafer and the mask that significantly improved the quality of the photolithographic process. The results obtained both with and without the thin liquid layer are described below. The function of the ultra-thin layer 24 has not yet been identified. However, one possibility is that it might serve as a refractive element to collimate off-axis radiation from the lamp, thereby improving resolution at the surface. It undoubtedly also serves a photochemical purpose, possibly in forming a thin oxide film.

After the Si wafers were exposed to VUV radiation, they were placed into a gold electroplating solution (Transene TSG-250) having a temperature of 36-51 degrees Centigrade. The voltage and current of the electroplating solution are dependent upon the geometry of the pattern to be deposited, but also the doping of the wafer, its conductivity, and other parameters such as the desired thickness of the gold features. With this simple, commercially-available electroplating system, gold was electrodeposited only onto the unexposed parts of the wafer, which is defined as a positive-tone patterning process, wherein the metal features on the wafer replicate the metal features of the mask. It has also been demonstrated that this process may be inverted—that is, gold is deposited only onto the exposed portions of the wafer, which is defined as a negative-tone patterning process. This is accomplished with the same procedure described above, except that the step of stripping the native oxide from the Si wafer with hydrofluoric acid and DI water is bypassed. That is, the Si substrate is only degreased prior to exposure to the VUV lamp. In short, the experiments demonstrated that both positive and negative Photoresist-Free Photolithography (PFP) are realized with a 172 nm lamp and the chemical processes outlined above. Secondly, if the semiconductor substrate is only degreased and a thin oxide layer is present on the substrate surface when the substrate is irradiated by the VUV lamp, we presume that electrodeposition occurs only on the exposed portions of the substrate because the VUV photons alter photochemically the oxide surface so as to promote deposition of the metal onto the underlying thin oxide film.

Figure 2:
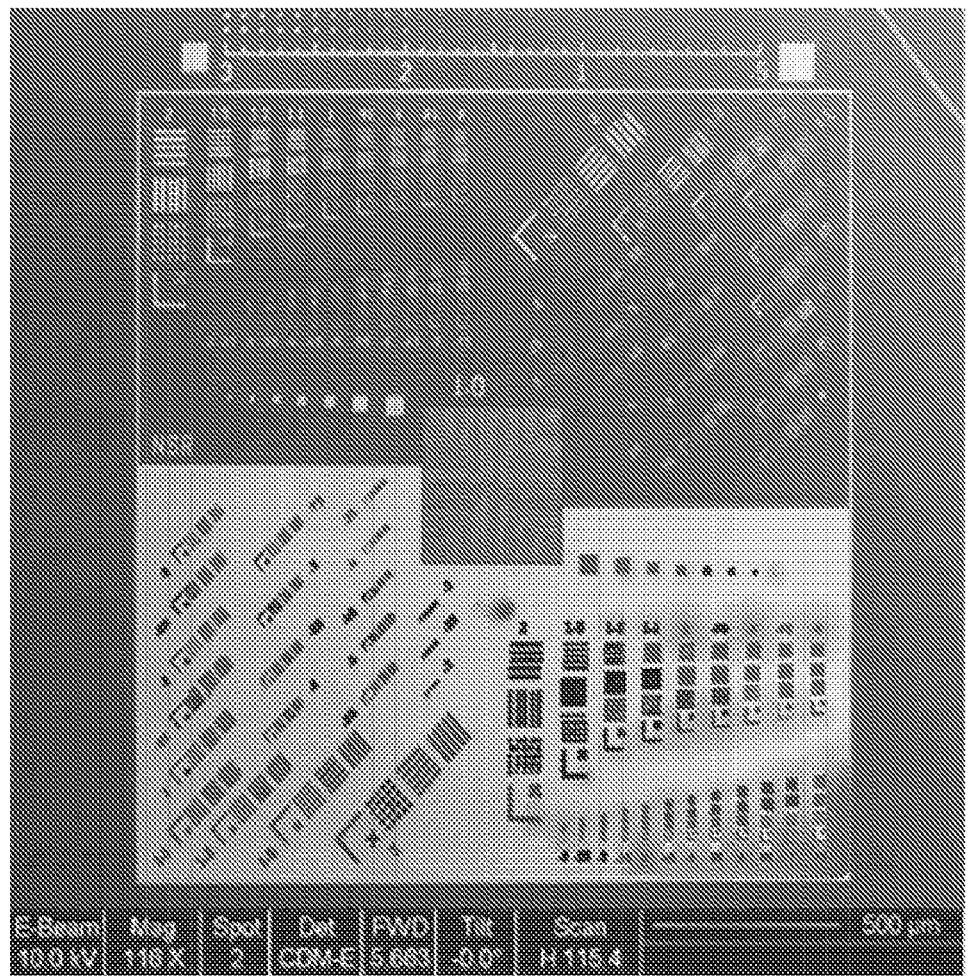
FIG. 2 is a scanning electron micrograph (SEM) of gold film patterns electrodeposited onto regions of a Si wafer that are exposed ("light-field"-upper panel) or non-exposed ("dark-field"-lower panel) to the VUV lamp source.

FIG. 2 presents scanning electron micrographs (SEMs) of gold features (the light-colored regions) deposited onto Si (dark portions of the image). The SEM shows features that were deposited by the positive photolithographic process in which 500 μL of hydrogen peroxide was applied between the mask and the Si wafer. Features as small as 800 nm are resolved and higher spatial resolution is expected with contact masks of higher quality and resolution. To obtain these electroplated patterns, the Si wafer was exposed for 2 minutes and the mask is a 4× reduction mask. Shorter exposure times are also effective. For Si wafers, for example, photon energy dosages of 100 mJ/cm$^2$ are sufficient for electroplating to occur on the substrate but may not be sufficient for high quality patterning. The minimum dosage (exposure time×lamp intensity) depends on the substrate/seed layer material and can be determined by exposing materials to increasing photon energy dosages until electrodeposition onto post-irradiated substrates is observed. Nevertheless, significantly higher photon energy dosages of one or more J/cm$^2$ are expected to function well for many materials. For example, experiments have shown that dosages of 4 J/cm$^2$ consistently produce electroplated patterns of the highest spatial resolution observed with a wide variety of substrate materials.

Figures 3A, 3B:
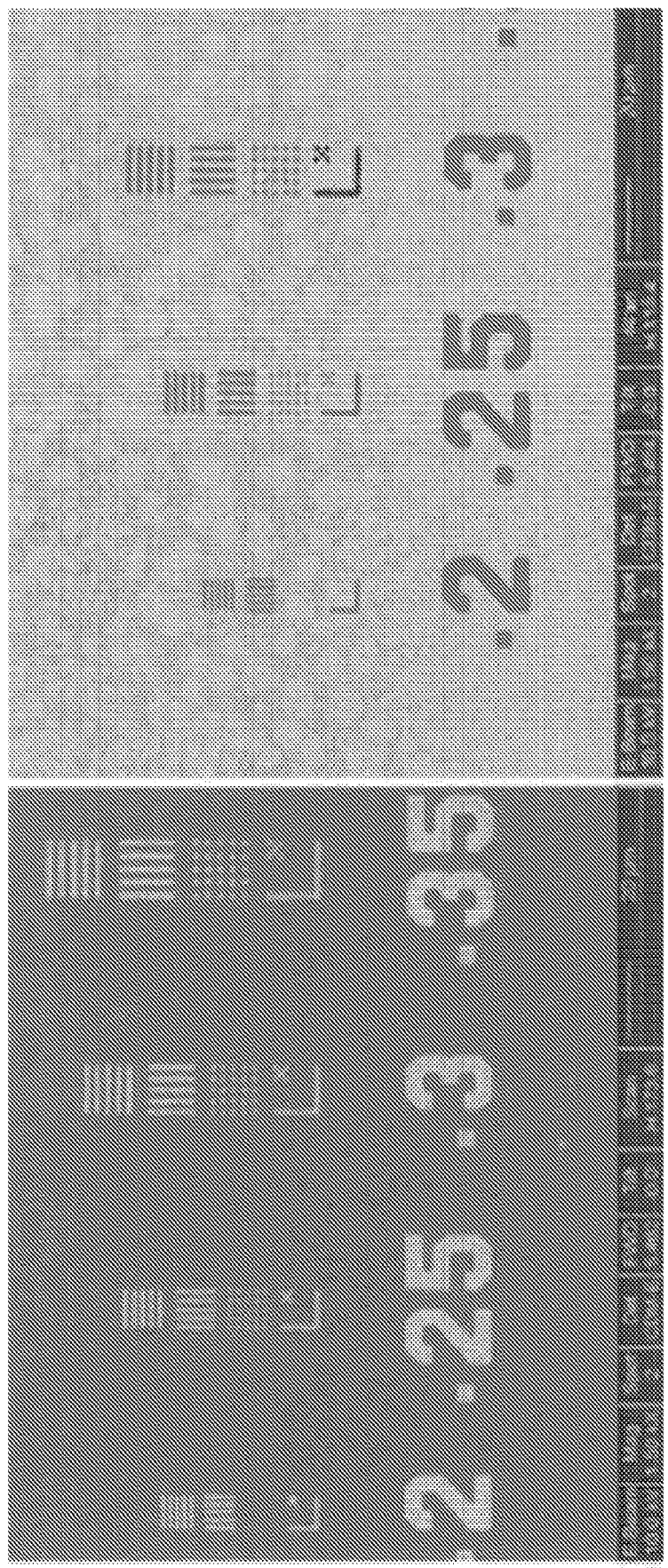
FIGS. 3A and 3B are magnified views of two portions of the images of FIG. 2.

A magnified view of a portion of both SEMs of FIG. 2 is shown in FIGS. 3A and 3B. The gold-coated areas are the light-colored regions of the image. These and many other images recorded to date demonstrate that the spatial resolution of this photoresist-free process appears to be the same for both the light-field (mask is composed mainly of transmitting fused silica, FIG. 3A) and dark-field (mask is composed mainly of light-blocking metal, left half of FIG. 3B) selectively-electroplated structures.

Figure 5:
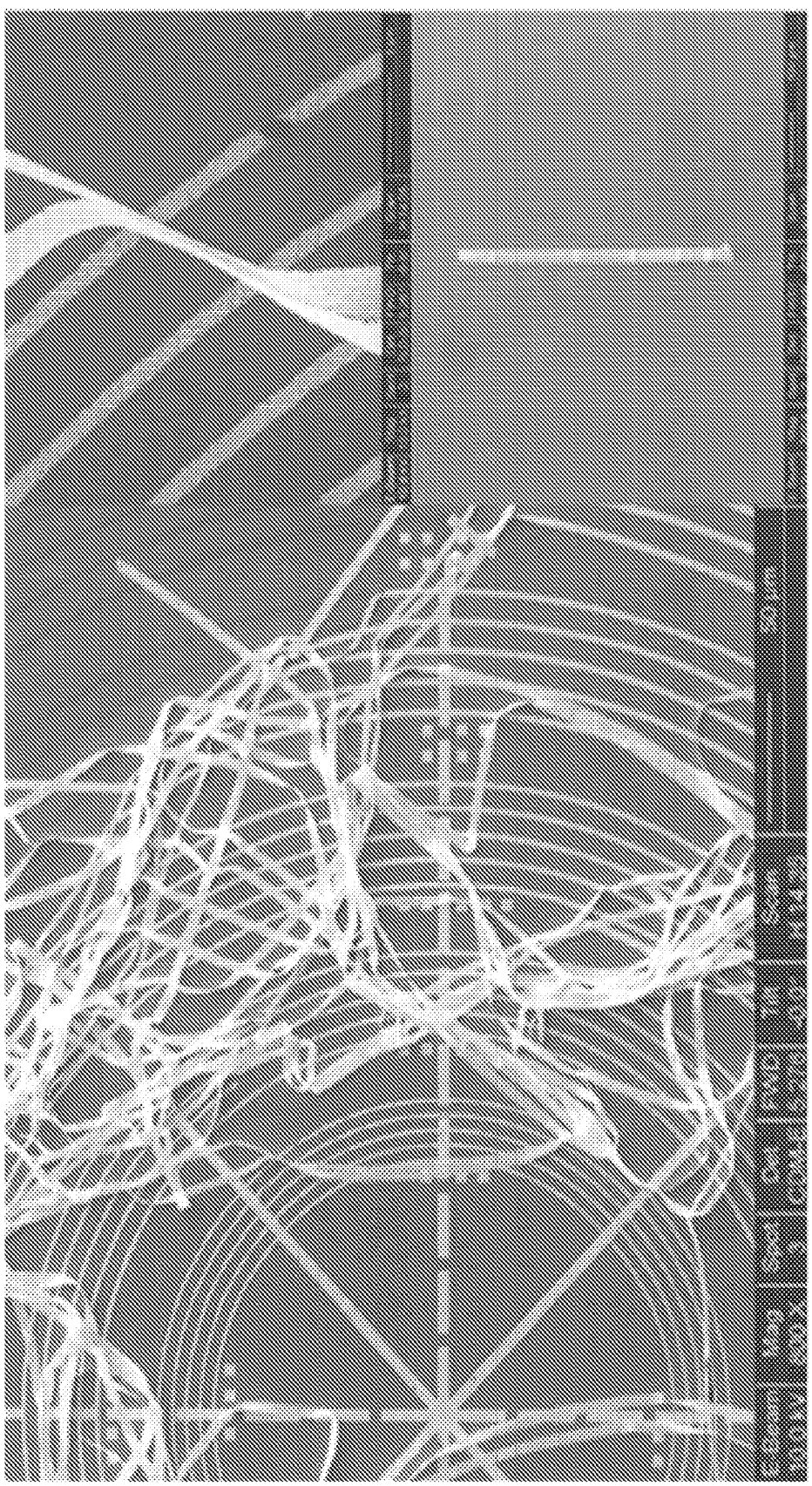
FIG. 5 is an SEM of a gold pattern, deposited by the positive photodeposition process (light-colored regions are gold-coated) with a portion having been lifted off.
Figure 7A:
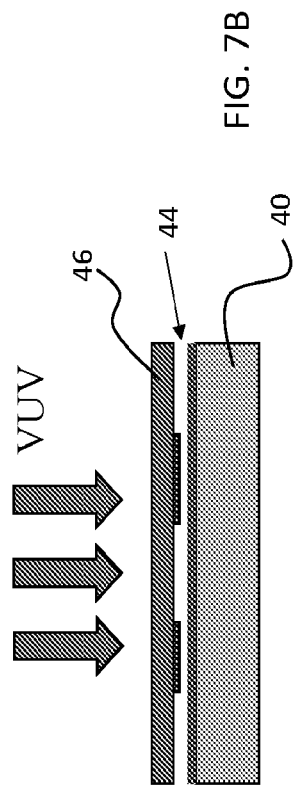
FIGS. 7A-7D illustrate the process sequence for a preferred method for electroplating gold or copper onto a material surface (substrate) with a seed nickel film.
Figure 7B:
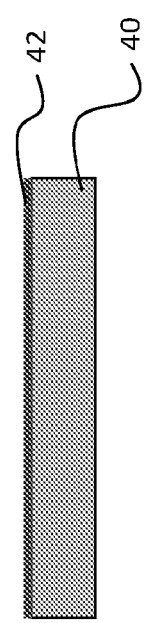
Figure 7C:
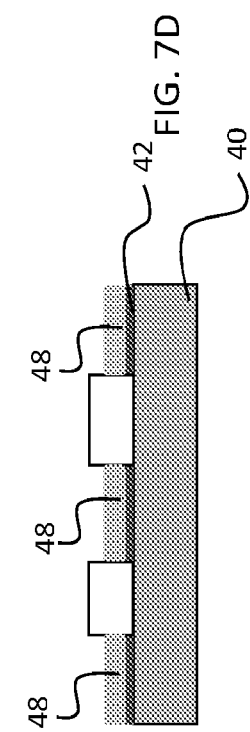
Figure 7D:
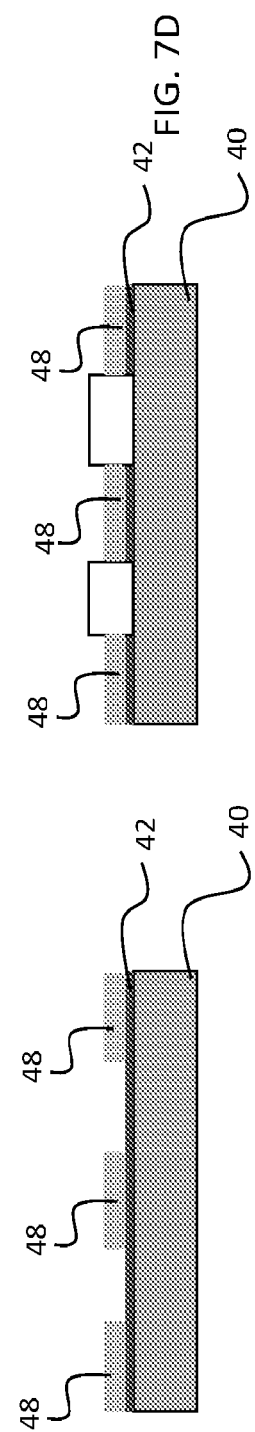

The preferred process was tested for scores of patterns and substrates and the results show that the uniformity and resistivity of gold deposition is excellent over surfaces 2" in diameter. FIGS. 4A and 4B are images at two magnifications of a gold pattern deposited by the positive (light-field) photo-electrodeposition process. The image at right has a resolution that is a factor of five greater than that for the image at left. These images indicate that the deposition of gold is uniform, regardless of whether the feature density is high (left) or low (right). FIG. 5 is an SEM of a gold pattern, deposited by the positive photo-electrodeposition process (light-colored regions are gold-coated), for which a portion of the pattern has been lifted-off by aggressive rinsing with water. The thickness of the gold film is approximately 100 nm. For 100 nm-thick electrodeposited gold films, for example, the conductivity of the films is measured to be 40 µohm-cm which is close to the conductivity of bulk gold. In addition, the thickness of the gold films can be controlled through the electrodeposition conditions, including the molar concentration, solution temperature, and exposure time. An important aspect of the gold films deposited by present methods is that the gold films themselves are robust. Consider, for example, the image at left in FIG. 5, which shows a pattern of gold films that was grown by the positive photodeposition process. After the pattern was grown, aggressively rinsing the structure with water caused a portion of the gold ribbon to "lift off" the surface, but notice that the ribbon remains intact. That is, the gold ribbon is contiguous and robust, despite having been removed from a portion of the surface. Expanded views of segments of the gold ribbon are shown at right in FIG. 5.

Although the gold film of FIG. 5 was removed in a somewhat chaotic fashion, we have found that the gold patterns grown by either the positive or negative processes can readily be transferred from Si to another (arbitrary) substrate by first sonicating the gold-coated Si substrate in DI water which causes the gold film to lift-off the substrate. Placing the new substrate under the gold film and gently lifting the new substrate from the water cause the gold film to bond to the new substrate. In addition, adhesives such as Scotch tape are also effective in transferring gold films to new substrates.

We have also shown that the processes described above work equally well on Si substrates of differing orientations. To date, the following Si wafer orientations have been tested: (100), (111), and (110). Furthermore, tests conducted on lightly-doped (less than 1 ohm-cm resistivity) and mid-level doped (7-10 ohm-cm) wafers yielded essentially the same results. It is expected that other semiconductor substrates of various orientations will also serve well as substrates for the preferred methods.

The applications of these wafer processing and film growth techniques appear to be quite broad, primarily because the ability to dispense with the photoresist while maintaining sub-micron spatial resolution lowers dramatically the cost of fabricating electronic, MEMs, plasmonic and optical devices. A simple example of the latter two fields is shown in FIGS. 6A-6D, where FIGS. 6B-6D show two large arrays of gold "fingers" deposited by the positive photoelectrodeposition process. FIGS. 6A-6D are photographs of arrays of gold lines ("fingers") grown by the positive photoelectrodeposition process.

In FIG. 6D, the widths of the fingers can be seen to be approximately 1 µm which is sufficiently small for the arrays to act as an optical diffraction grating. FIG. 6A is a photograph of a Si wafer onto which a large number (16 rows) of these Au diffraction gratings have been deposited. The diffraction of visible light around the perimeter of the grating is readily observed. Gentle thermal annealing of the entire structure has the effect of smoothing the films.

Our testing indicates that mirrors, gratings, and Fresnel lenses are only the beginning of the optical devices that can be fabricated inexpensively by these techniques. Since gold is also the most prominent of plasmonic materials, plasmonic antennas and other devices are clearly now accessible with this inexpensive and rapid fabrication procedure. Furthermore, many such optical structures can be fabricated simultaneously.

Although the above discussion has described the process by which metal films such as gold and copper can be electrodeposited onto Si in a spatially-selective manner without the need for a photoresist, semiconducting substrates other than Si may also be used. For, example, tests show that indium phosphide (InP) also serves equally well as a substrate. All experiments to date suggest that a wide variety of semiconducting substrates, including SiC, Ge, and the binary, ternary, and quaternary III-V semiconductor materials such as GaAs, AlGaAs, and InGaAsP, respectively, will perform equally well as substrates for the processes described here. It is only necessary that the substrate material be partially conducting (i.e., semiconducting). Furthermore, although the discussion above has concerned the electrodeposition of gold and copper onto semiconducting substrates, it is expected that all metals commonly electrodeposited onto conducting materials, including gold, copper, palladium, and platinum, are available to the processes described here.

FIGS. 7A-7D show a preferred method for electroplating gold, copper, or other metal such as palladium or platinum onto a material surface (substrate) 40, which may be conductive, semiconducting, or insulating, with a seed conductive film 42 (for example, Ni) that is situated atop a Cr layer (not shown). Generally, any deposited conductive layer or multiple layers of conductive materials can be used for the conductive film 42. The only purpose of the Cr layer is to promote adhesion of the seed layer to the substrate. The presence of the Cr layer is not required but is typically desirable when the substrate material is electrically-insulating. The thicknesses of the Ni and Cr films are typically less than 100 nm. Gas or liquid 44 (such as water or hydrogen peroxide) may again be injected into the narrow gap between mask 46 and the substrate 40 so as to enhance film deposition and quality. After exposure of the substrate through the mask, and removal of the mask 46, placing the substrate 40 into an electroplating solution and conducting the electroplating process, a gold film 48 is deposited only onto portions of the nickel surface 42 that were not exposed to the VUV radiation. After the desired deposition is complete, the Ni layer 44 can be selectively etched to expose the substrate 40 between the gold deposits. Additional experiments have shown that the method of FIGS. 7A-7D allows for the selective-area (patterned) deposition of gold or copper onto a variety of other material substrates or surface layers deposited onto a substrate. Specifically, the electrodeposition of gold, copper, palladium, platinum, and other metals commonly deposited by electrodeposition onto electrically-conducting, semiconducting, and electrically-insulating thin films and bulk materials such as nickel (Ni), indium tin oxide (ITO), Si (described earlier), InP, chromium, gold, and glass have already been demonstrated. The latter substrate (glass) is of particular importance to the display industry. All of these processes differ slightly in the lamp exposure times required, film growth rates in electroplating solutions, and quality of the plated metal, but each provides the capability for plating gold, copper, and other metals onto substrate materials that have not allowed plating previously. One example is the realization of direct electroplating of gold onto gold, and gold onto ITO. The latter is also a material in widespread use in industry for the manufacture of displays. For this reason, forming high quality (low resistance) gold, copper, palladium, or platinum contacts onto ITO films, and doing so inexpensively and quickly, is of benefit to the electronics industry. It should also be emphasized that electroplating of gold onto ITO, as well as the electrodeposition of all metals onto conducting surfaces, occurs only on those portions of the ITO substrate that were not exposed to the light source.

Because chromium (Cr) and Ni are often employed as electrode materials in a wide range of displays and electronic products, a photoresist-free process for fabricating arrays of gold, copper, or other metal electrodes on virtually any surface is provided in FIGS. 7A-7D. The method preferably begins by cleaning the substrate 40 and depositing a thin (5-20 nm thick) Cr film (not shown) on the substrate. This Cr film is generally deposited by sputtering, and is required only if adhesion of the subsequent metal layers to the substrate is problematic. For conductive or semiconducting substrates, therefore, the Cr layer is not necessary.

The second step is to deposit 20-100 nm of Ni 42 or other conductive seed material such as gold onto the Cr film, or directly onto the substrate (if Cr is not required). Again, sputtering and other conventional film deposition techniques may be employed. The substrate 40 is then exposed through the mask 46 with VUV radiation (i.e., having wavelengths nominally in the 160-200 nm wavelength region). The photomask 46 is generally in hard contact with the substrate but projection and proximity exposure configurations, well-known to those in the field of photolithography, are also acceptable.

After exposure of the substrate 46, a film of gold or another metal such as copper, palladium, or platinum can be electroplated only onto the unexposed portions of the substrate. After the desired gold (or other metal) has been electroplated, the underlying Ni seed layer 42 may be removed by etching so as to yield an array of gold pads, arrays of wires, or, in fact, any geometric pattern desired. Also, the seed for the process of FIG. 7 need not be Ni. Gold and chromium also serve equally well, and other metals such as titanium are also expected to function in this capacity. As an example of the capability of this method, an array of gold squares was electrodeposited onto an underlying Au film which, in turn, had been deposited onto a Ni seed layer. The gold squares (pads) were as small as 3-4 µm. Intensity line-outs of this array showed a consistently uniform thickness of the gold pads throughout the array.

Another embodiment of the invention entails the deposition of metals onto conducting substrates by an electroless processes. For example, the exposure of conductive substrates to the VUV lamp source appears to passivate the surface. Dipping the exposed substrate into electroless plating solution will allow for deposition of metal onto only the unexposed portions of the substrate. Because the exposure of the substrate by the VUV lamp charges or otherwise modifies the surface of the substrate, area-selective electroless plating is also suitable for non-conducting or partially conducting dielectric surfaces such as ITO.

Yet another embodiment of the invention entails changing a material surface from hydrophilic to hydrophilic by exposing that surface to VUV radiation. Hydrophilic surfaces are those on which water spreads quickly, forming a thin film of water on that surface. In contrast, hydrophobic surfaces are those on which water "beads-up" and does not form a uniform film Tests have shown that 172 nm lamps, for example, transform the surfaces of a variety of materials from hydrophilic to hydrophobic. This capability provides access to a wide variety of devices of interest to optics, biomedicine and electronics. As one simple example, we have fabricated optical components, such as Fresnel lenses, in polymers such as PMMA and such lenses only focus light when moisture is applied to the portions of the surface that have been made hydrophobic by the VUV lamp. If one breathes on the lens, for example, the moisture in one's breath results in the lens performing well until the moisture evaporates. This concept can be employed to design eyeglasses that do not "fog" for swimmers, or those in nautical environments. This embodiment does not require electroplating subsequent to exposure of the substrate to a VUV source through a photomask. It is only the exposure of a surface of a material to the VUV lamp radiation that renders the surface hydrophobic.

An example of the embodiment of the invention that involves electroless deposition is the following. The substrate is first exposed to the VUV radiation through a photomask as before. Subsequently, a carbohydrate such as dextrose is dissolved in water and the patterned substrate is dipped into the dextrose/water solution. The solution will selectively wet only those portions of the substrate that have been exposed to, and chemically modified by, the VUV lamp radiation. Silver can then be selectively deposited onto the patterned region with Tollen's reagent.

Another example of the capability of the invention with respect to electroless deposition and plating concerns printed circuit boards (PCBs). First, one cleans (degreases and etches) a copper-clad (FR4, for example) or composite metal/dielectric/metal PCB substrate. Subsequently, a metal surface is exposed to the VUV lamp radiation through a photomask having the desired geometry. Gold is then deposited onto the unexposed regions of the metal surface by either electro-deposition or electroless deposition. The final step entails the use of gold as an etch mask for copper. That is, the PCB substrate can be immersed (with its gold pattern in place) in a solution of ferric chloride or other copper etchant which is typically based on HCl. Because gold is not etched by copper etchants, the gold pattern will prevent etching of that portion of the copper layer that is covered by gold. This process is preferable to the conventional method which requires the application of a photoresist to the PCB surface, and then the exposure of the photoresist by an ultraviolet source. The photoresist is then developed to produce the desired pattern and the copper is etched. However, the photoresist must then be removed before plating gold on the patterned copper. Consequently, the advantage of this embodiment of the invention is the same as that for all other embodiments: namely—the application and subsequent removal of a photoresist is no longer necessary. Consequently, the economic and environmental costs associated with photoresists can be eliminated.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for photoresist-free photolithography to pattern a surface of a conductor or semiconductor substrate and deposit a material film, the method comprising:
   cleaning the surface of the conductor or semiconductor substrate;
   generating photons with a VUV lamp emitting a specific wavelength in the range of 160 nm-200 nm or wavelengths extending over a fraction of the 160-200 nm range and intensity sufficient to alter the surface of the conductor or semiconductor substrate;
   directing the photons through a patterned mask to alter the surface chemistry or structure of the conductor or semiconductor substrate in those areas defined by the mask pattern;

removing the patterned mask;

selectively depositing, without using any photoresist, the material film onto the surface of the conductor or semiconductor substrate in areas exposed, or not exposed, by the mask pattern.

2. The method of claim 1, wherein the conductor or semiconductor substrate comprises a silicon wafer.

3. The method of claim 1, wherein the conductor or semiconductor substrate is selected from the group consisting of SiC, InP, and other III-V semiconductors.

4. The method of claim 1, wherein the VUV lamp comprises a microplasma flat lamp generating the photons at an intensity above approximately 10 mW/cm$^2$.

5. The method of claim 1, wherein the mask is a contact mask.

6. The method of claim 1, wherein the mask is a projection mask.

7. The method of claim 1, wherein the selectively depositing material comprises electroplating a metal.

8. The method of claim 1, wherein the directing comprises providing an ultra-thin layer of water or hydrogen peroxide in the region between the substrate and mask so as to enhance contrast and bonding.

9. The method of claim 1, wherein selectively depositing comprises depositing a metal film onto a partially conducting dielectric.

10. The method of claim 1, conducted in a chamber allowing for gas flow into the chamber and a mask proximate to the surface of the material.

11. The method of claim 1, wherein the selectively depositing comprises depositing a metal seed layer and then electrodepositing a metal film onto a metal seed layer.

12. The method of claim 1, wherein the mask pattern is provided by masking layer and the method comprises providing a thin liquid layer between the substrate and the masking layer.

13. A photolithography or photoprocessing fabrication tool, comprising:

a chamber;

a gas inlet and exhaust;

a wafer or substrate holder;

a VUV lamp photon source having a specific wavelength that is in the range of 160 nm-200 nm or wavelengths extending over a fraction of the 160-200 nm range and intensity sufficient to break chemical bonds in and alter surface chemistry or structure of a semiconductor surface; and a mask for masking the VUV light directed toward a surface of a wafer or substrate on the holder.

14. The tool according to claim 13, wherein the chamber is a non-vacuum chamber open for gas flow and the mask is proximate to the surface of the material.

15. A method for photoresist-free deposition of metal onto a material surface, the method comprising:

depositing a seed film onto the material surface;

generating photons with a VUV lamp having a specific wavelength that is in the range of 160 nm-200 nm or wavelengths extending over a fraction of the 160-200 nm range and intensity sufficient to break chemical bonds in and alter surface chemistry or surface structure of the seed film;

directing the photons through a mask pattern to alter surface chemistry or surface structure of the seed film in the mask pattern; and electroplating metal, without using any photoresist, onto the seed film in areas not exposed by the mask pattern.

16. The method of claim 15, wherein the material surface is selected from the group consisting of a metal surface, a semiconductor surface, an indium tin oxide surface, a glass surface, a polymer surface, a crystal surface, and a sapphire surface.

17. A method for photoresist-free deposition of metal onto a dielectric surface, the method comprising:

generating photons with a VUV lamp having a specific wavelength that is in the range of 160 nm-200 nm or wavelengths extending over a fraction of the 160-200 nm range and intensity sufficient to break chemical bonds in and alter the surface chemistry or surface structure of the dielectric surface so as to produce surface charge;

directing the photons through a mask pattern to alter surface chemistry or structure of the dielectric surface according to the pattern of the mask; and without using any photoresist, depositing metal by electroless deposition onto the dielectric surface to create a metal film pattern in the pattern of the mask.

18. A method for photoresist-free alteration of a material surface in a pattern, the method comprising:

generating photons with a VUV lamp having a specific wavelength in the range of 160 nm-200 nm or wavelengths extending over a fraction of the 160-200 nm range and intensity sufficient to break chemical bonds in and alter surface chemistry or structure of the surface; and directing the photons at the surface for a sufficient amount of time so as to break chemical bonds in and alter the surface chemistry or structure of the surface and produce a pattern in the material surface.

19. The method of claim 18, wherein the material surface is changed from being hydrophilic to hydrophobic, or hydrophobic to hydrophilic, in the pattern in the material surface.

20. The method of claim 18, wherein the surface is a semiconductor, dielectric, or metal surface.

* * * * *